US006901568B2

(12) United States Patent
Noguchi

(10) Patent No.: US 6,901,568 B2
(45) Date of Patent: May 31, 2005

(54) METHOD FOR FABRICATING TRANSISTOR

(75) Inventor: Akira Noguchi, Kanagawa (JP)

(73) Assignee: NEC Electronics Corporation (JP)

( * ) Notice: Subject to any disclaimer, the term of this patent is extended or adjusted under 35 U.S.C. 154(b) by 215 days.

(21) Appl. No.: 10/420,982

(22) Filed: Apr. 22, 2003

(65) Prior Publication Data

US 2003/0199145 A1 Oct. 23, 2003

(30) Foreign Application Priority Data

Apr. 23, 2002 (JP) .................................... 2002-121136

(51) Int. Cl.$^7$ .............................................. G06F 9/45
(52) U.S. Cl. ............................ 716/5; 716/4; 716/18; 438/795
(58) Field of Search ........... 716/4, 5, 18; 438/289–291, 438/308, 530, 795

(56) References Cited

U.S. PATENT DOCUMENTS

| | | | | |
|---|---|---|---|---|
| 4,626,450 A | * | 12/1986 | Tani et al. ................... | 438/220 |
| 5,587,330 A | * | 12/1996 | Yamazaki .................... | 438/162 |
| 5,970,384 A | * | 10/1999 | Yamazaki et al. ........... | 438/795 |
| 6,027,977 A | * | 2/2000 | Mogami ...................... | 438/287 |
| 6,295,630 B1 | * | 9/2001 | Tamegaya ...................... | 716/4 |
| 6,521,550 B2 | * | 2/2003 | Tanabe et al. .............. | 438/795 |
| 6,602,808 B2 | * | 8/2003 | Tanabe et al. .............. | 438/795 |
| 6,723,665 B2 | * | 4/2004 | Tanabe et al. .............. | 438/795 |

FOREIGN PATENT DOCUMENTS

| JP | 2000-114276 | 4/2000 |
|---|---|---|
| JP | 2001-176986 | 6/2001 |

OTHER PUBLICATIONS

Scovell, PD, et al., "Modelling of VLSSI semiconductor manufacturing processes", IOP Publishing Ltd, Rep. Prog. Phys. 52 (1989), pp. 349–388.*

* cited by examiner

Primary Examiner—Stacy A. Whitmore
(74) Attorney, Agent, or Firm—Ostrolenk, Faber, Gerb & Soffen, LLP

(57) ABSTRACT

Disclosed is a method for correcting a transistor of a predetermined threshold value. According to the method, after preparing a gate 13 of the transistor, depending on how well the gate is prepared, a threshold voltage Vth showing transistor characteristic is corrected by adjusting an oxygen concentration of a lamp-annealing step 21, which is to be performed subsequently. Moreover, disclosed is a method for fabricating a transistor of a predetermined threshold value. According to the method, after preparing the gate 13 of the transistor, the threshold voltage Vth showing the transistor characteristic is predicted or measured. When the threshold voltage deviates from the predetermined value, the oxygen concentration is adjusted in the lamp-annealing step 21 of the transistor that is to be fabricated subsequently and thus the threshold value is set to the predetermined value without lowered reliability due to the damage of the gate oxide film and without additional process steps.

16 Claims, 6 Drawing Sheets

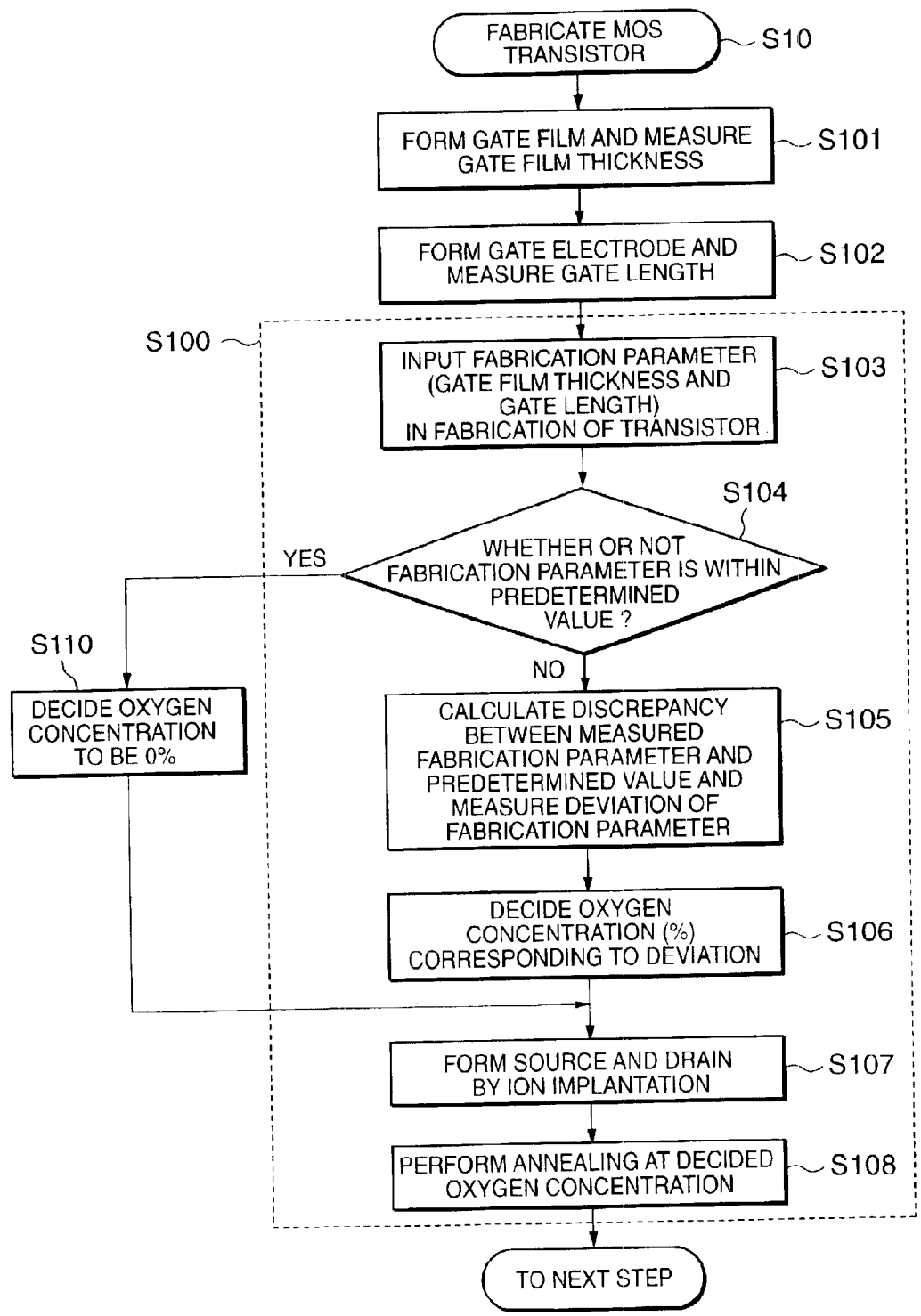

METHOD FOR FABRICATING TRANSISTOR

BACKGROUND OF THE INVENTION

1. Field of the Invention

The present invention relates to a method for fabricating a transistor, more particularly to a method for fabricating a transistor including a field effect transistor, while enabling the threshold voltage control.

2. Description of the Related Art

In general, a MOS (Metal Oxide Semiconductor) transistor in a field effect transistor includes a source region 11 and a drain region 12 on a semiconductor substrate 10, as shown in a cross-sectional view of FIG. 1. In the MOS transistor, a gate electrode 13 is formed on a gate oxide film (gate insulator) 14 provided between these regions 11 and 12.

The characteristic of a threshold voltage Vth (a voltage when the transistor is turned on) of a transistor is significantly affected by the thickness of a gate oxide film and the size of a gate. However, the threshold voltage Vth of a transistor sometimes cannot attain its target value depending on how well these constituents are formed. A method for correcting the transistor characteristic after fabricating the gate of the transistor, corresponding to how well the gate is formed, is disclosed in Publication of Unexamined Patent No. 2000-114276 (conventional example 1) or in Publication of Unexamined Patent No. 2001-176986 (conventional example 2).

In the conventional example 1, when the source region 11 and drain region 12 and the gate electrode 13 on the gate oxide film (insulator) 14 are formed on the semiconductor substrate 10, ion implantation for correction 20a is performed from an oblique direction, as shown in the cross-sectional view of FIG. 2.

The conventional example 1 is one correcting the transistor characteristic in such a manner that the ions are introduced into even a lower part of the gate electrode 13 by performing the correction ion implantation 20a from the oblique direction.

Moreover, in the conventional example 2, as shown in a flowchart of FIG. 3, impurity implantation for controlling a threshold value and annealing for activating source and drain regions are performed in areas just below gates of CMOS transistors formed on a plurality of wafers (Step S1). Thereafter, boron is implanted so that a region at a predetermined depth from the wafer surface has an impurity concentration at its peak, and phosphorus of an approximately equal amount to boron is implanted into the same region so as to have the impurity concentration at its peak therein (Step S2). Then, a threshold voltage of the wafer is measured (Step S3), and based on the measurement result (Step S4), annealing is performed for the wafer which requires the threshold voltage adjustment to activate boron and phosphorus (Step S6).

In this case, in the region at the predetermined depth from the wafer surface, variation in the impurity concentration is suppressed to maintain reliability to hot electrons. At the same time, on the wafer surface, the threshold value is arbitrarily adjusted by the variation of the impurity concentration due to the annealing.

However, in the case of the conventional example 1, when the ion implantation for correction 20a is performed from the oblique direction, the number of process steps is increased. Moreover, a drawback such as lowered reliability of the element or the like has arisen due to the damage caused by the ion implantation performed even to the sidewall of the gate oxide film.

Moreover, in the case of the conventional example 2, the annealing is performed for the wafer that requires the threshold voltage adjustment to activate boron and phosphorus. However, the threshold voltage could not be adjusted to a predetermined specific value.

SUMMARY OF THE INVENTION

In a method for fabricating a transistor according to the present invention, a gate film of the transistor is formed and a thickness thereof is measured (S101). Next, a gate electrode of the transistor is formed and a gate length thereof is measured (S102).

Thereafter, a fabrication parameter in the fabrication of the transistor is inputted (S103) and it is determined whether or not the fabrication parameter deviates from a predetermined value thereof (S104). If the fabrication parameter deviates from the predetermined value, a fabrication parameter discrepancy between the fabrication parameter and the predetermined value is calculated and a deviation of the fabrication parameter is predicted (S105). Then, corresponding to the deviation of the fabrication parameter, an oxygen concentration in inert gas of a lamp annealing is decided in the lamp-annealing step of the transistor that is to be subsequently fabricated (S106).

If the fabrication parameter does not deviate from the predetermined value, the oxygen concentration in the inert gas of the lamp annealing is decided to be 0% (S110).

Thereafter, source and drain regions of the transistor are formed by ion implantation (S107) respectively, and are lamp-annealed with the oxygen concentration in the inert gas of the lamp annealing (S106). Thus, the threshold value is set to the predetermined value.

In the above-described invention, the fabrication parameter is the gate length of the transistor and may also be the film thickness of the oxide film of the transistor. Moreover, when the oxygen concentration in the lamp-annealing step is increased, the threshold voltage Vth of the transistor can be increased. Moreover, as to the oxygen concentration in the lamp-annealing step, a ratio of the oxygen in the inert gas is set to a predetermined value, thereby enabling the threshold voltage Vth to be set.

A characteristic of the present invention is that, after forming a gate electrode of a transistor, a transistor characteristic can be corrected depending on how well the gate electrode is formed, by use of an oxygen concentration in a subsequent lamp-annealing step.

BRIEF DESCRIPTION OF THE DRAWINGS

FIG. 5 depicts a process flowchart according to the method for fabricating a transistor of the one embodiment of the present invention.

DETAILED DESCRIPTION OF THE PREFERRED EMBODIMENTS

Figure 1:
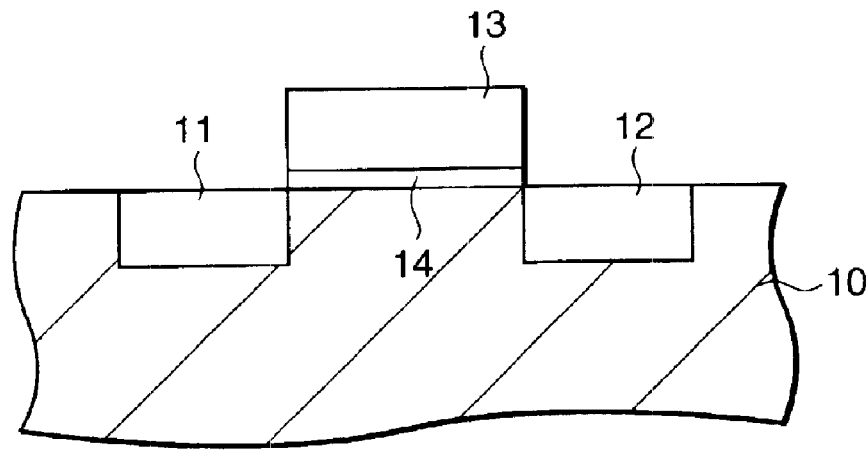
FIG. 1 depicts a cross-sectional view of a conventional transistor.
Figure 2:
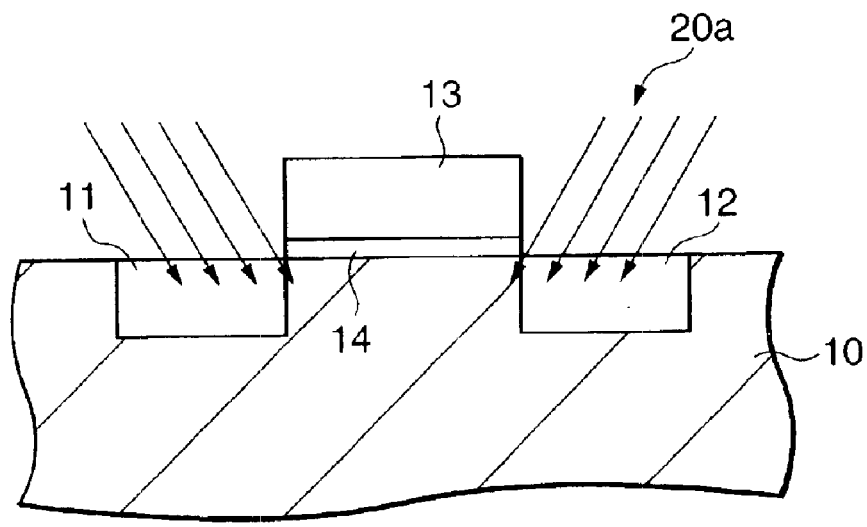
FIG. 2 depicts a cross-sectional view in the case of changing a characteristic of the transistor of FIG. 1.
Figure 3:
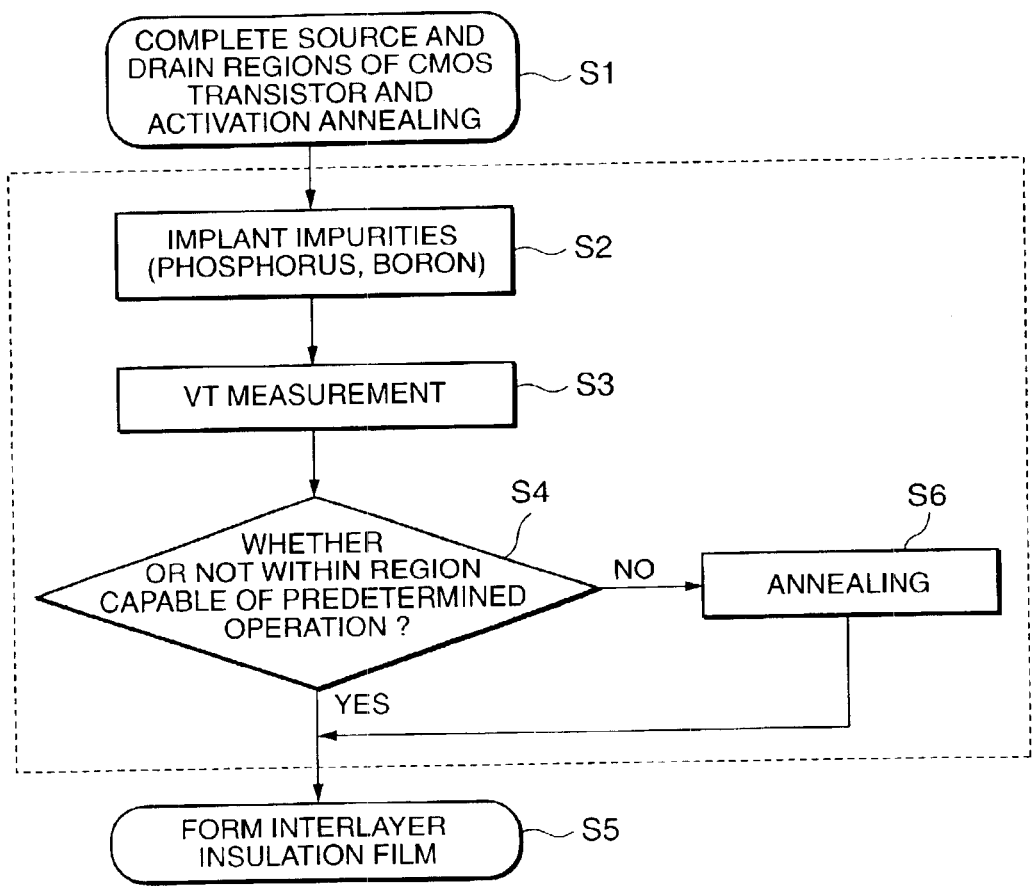
FIG. 3 depicts a flowchart in the case of changing a characteristic of another transistor in a conventional example.

Next, by referring to the drawings, an embodiment of the present invention will be described in detail.

Figure 4A:
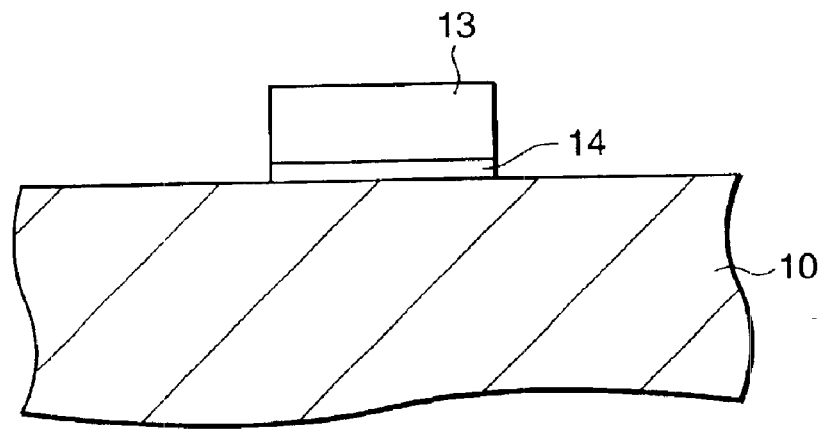
FIG. 4A depicts a cross-sectional view for explaining a method for fabricating a transistor of one embodiment of the present invention.
Figure 4B:
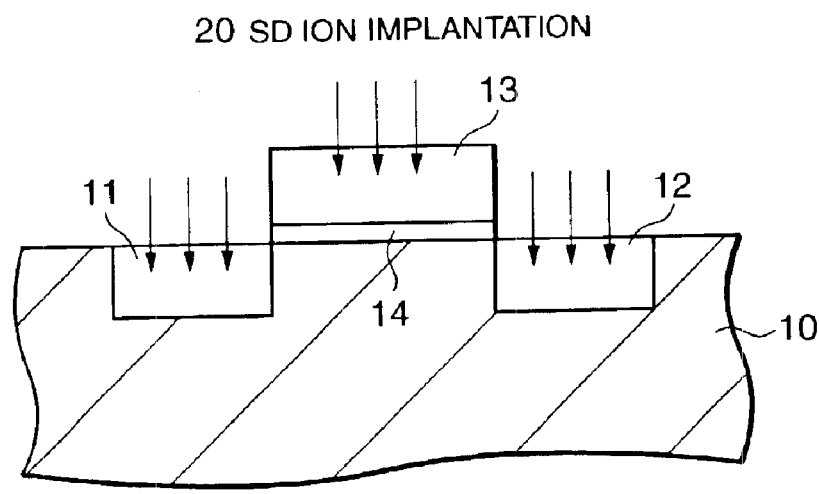
FIG. 4B depicts a cross-sectional view for explaining the method for fabricating a transistor of the one embodiment of the present invention, which is subsequent to FIG. 4A.
Figure 4C:
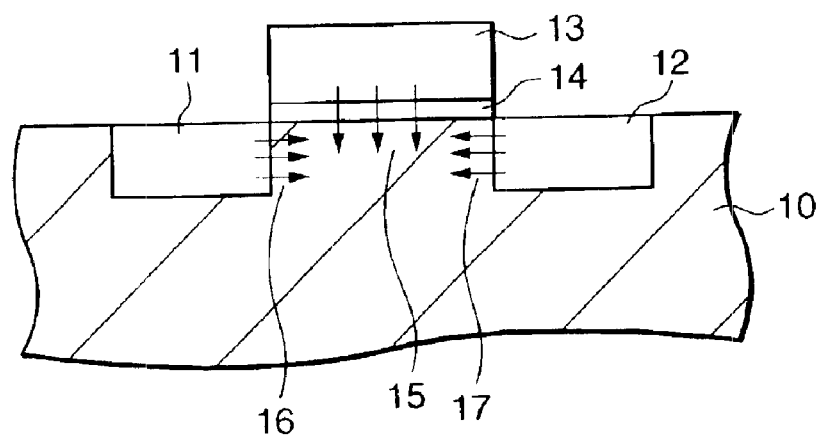
FIG. 4C depicts a cross-sectional view for explaining the method for fabricating a transistor of the one embodiment of the present invention, which is subsequent to FIG. 4B.

FIGS. 4A, 4B and 4C depict cross-sectional views of a transistor, which are respectively formed in the order of steps in the one embodiment of the present invention. FIG. 5 depicts a process flowchart according to a method for fabricating a transistor of the one embodiment of the present invention.

First, in fabrication steps of the above-described method for fabricating a transistor, similarly to the conventional example, a gate insulation film (oxide film) 14 is formed on a semiconductor substrate 10, in Step S101 of FIG. 5. In this event, based on a well-known ability of fabrication process control, a film thickness of the gate insulation film 14 is measured.

As a fabrication parameter in the fabrication of the transistor, the film thickness of the gate film of the transistor is used. In fabricating the transistor, a concentration of raw material gas is controlled by use of a well-known mass flow controller. Corresponding to the controlled raw material gas concentration, gate films are formed on a wafer for product, on which chips including transistors are mounted, and on a wafer for monitoring a gate film thickness. The film thickness of the gate film of the transistor is measured on the wafer for monitoring a gate film thickness. Then, an average value of these data is obtained and is adopted as a representative value of a lot.

Next, in Step S102 of FIG. 5, a gate electrode 13 is formed on the gate insulation film 14 (see FIG. 4A). In this event, based on the well-known ability of fabrication process control, a length of the gate electrode 13 is measured.

Figure 7:
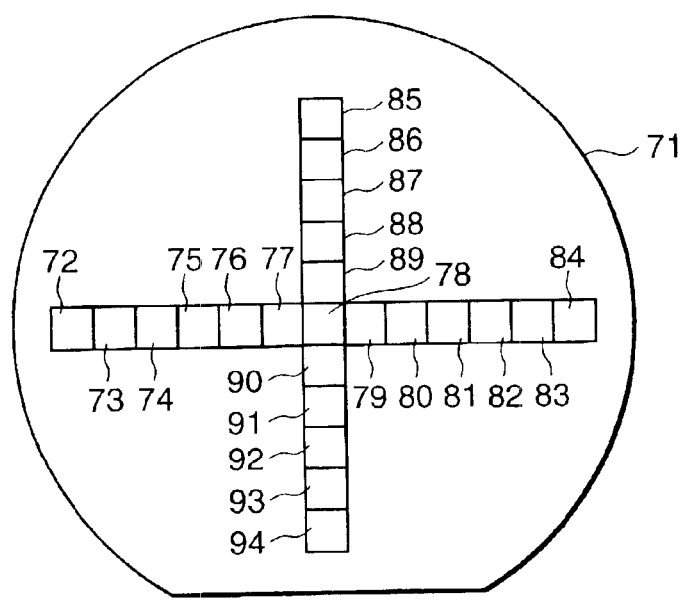
FIG. 7 depicts a view showing measurement spots on a wafer in a measurement step according to the method for fabricating a transistor of the one embodiment of the present invention.

Similarly to the film thickness of the gate film of the transistor, the gate length of the transistor is generally used as the fabrication parameter in the fabrication of the transistor. Corresponding to individual product chips having gate length monitor patterns, this gate length is measured. The measured values are collected respectively, for example, from the product chips present at a central position 78 within one piece of wafer 71, from several spots (72 to 84) on the product chip present in the X direction along the center of the wafer 78 and from several spots (85 to 94) on the product chip present in the Y direction along the center of the wafer 78 (FIG. 7).

Then, from a lot in the fabrication, plural pieces of wafers, for example, the number of wafers equivalent to about 10% of one lot of wafers, are sampled and the transistor gate lengths thereof are measured. An average value of the data is obtained and is adopted as a representative value of the lot.

Figure 8A:
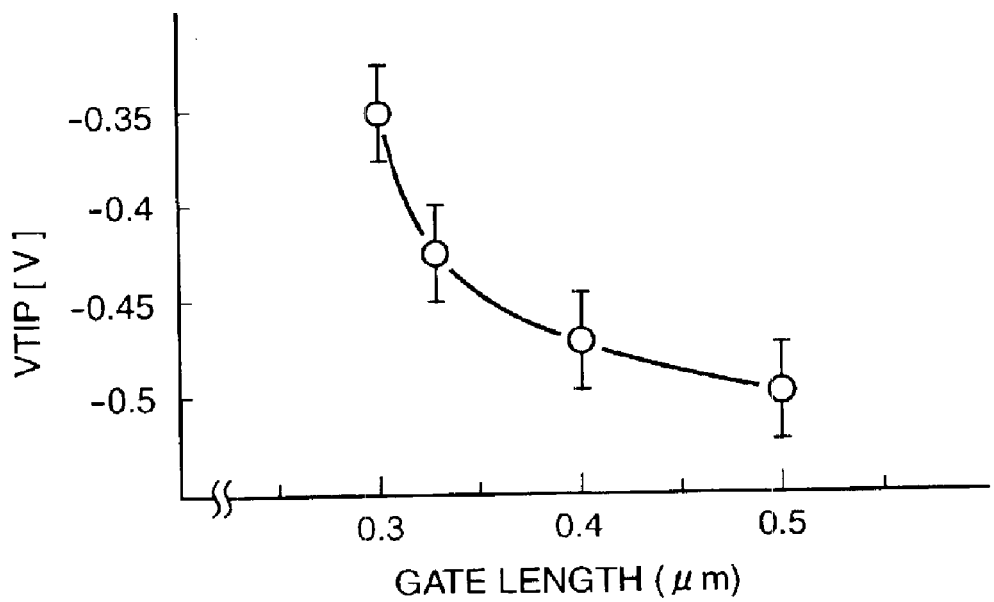
FIG. 8A depicts a graph showing a correlation between a gate length of a transistor, that is a fabrication parameter in fabrication of the transistor, and a threshold voltage of the transistor.
Figure 8B:
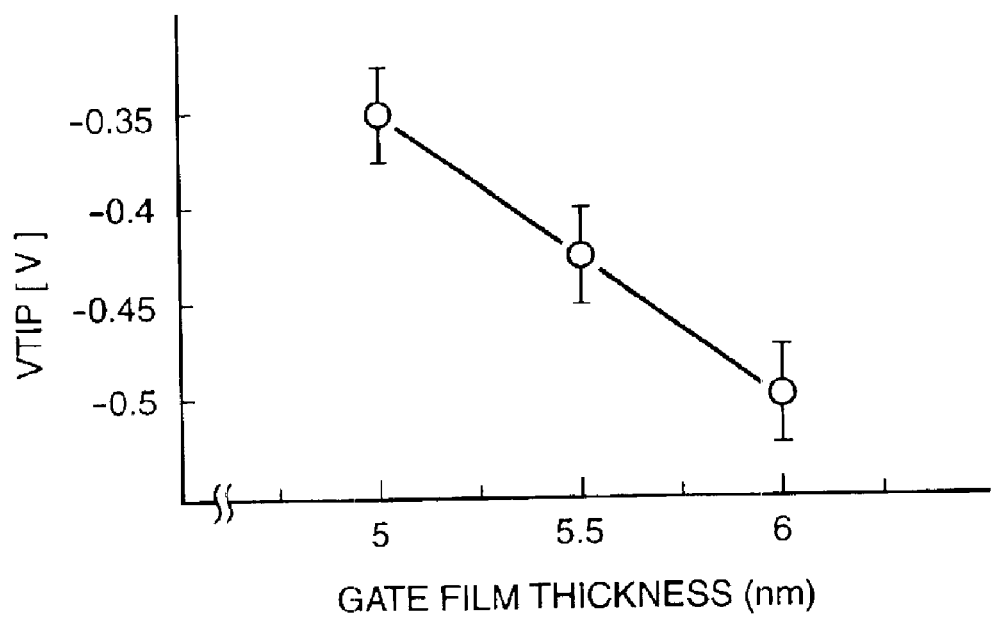
FIG. 8B depicts a graph showing a correlation between a gate film thickness of a transistor, that is a fabrication parameter in fabrication of the transistor, and the threshold voltage of the transistor.

Here, as shown in FIG. 8A, a threshold value of the transistor has a correlation with the gate length of the transistor, which is the fabrication parameter in the fabrication of the transistor. Moreover, as shown in FIG. 8B, the threshold value thereof has a correlation with the film thickness of the gate film of the transistor. In general, these correlations are gathered in each manufacturing plant and accumulated therein as statistical data (see FIGS. 8A and 8B).

As a result, in accordance with the statistical data shown in FIGS. 8A and 8B, a threshold value of a transistor of a certain lot, which has an actually measured fabrication parameter, is predicted. In other words, in the case where the subsequent ion implantation is performed under standard conditions of a manufacturing plant, a threshold value of a fabricated transistor can be predicted from the above-described correlation data.

Next, in Step S103 of FIG. 5, data of the gate length of the transistor, which is the fabrication parameter in the fabrication of the transistor, is inputted. Similarly, in Step S103 of FIG. 5, data of the gate film thickness of the transistor, which is the fabrication parameter in the fabrication of the transistor, is inputted.

Then, in the fabrication flow, it is determined whether or not the measured fabrication parameter deviates from a predetermined value of the fabrication parameter (S104). If the measured fabrication parameter deviates from the predetermined value, a discrepancy between the measured fabrication parameter and a target predetermined value is calculated from the above-described correlation data and a deviation of the fabrication parameter is predicted (S105). Next, an oxygen concentration (5) corresponding to the discrepancy is decided (S106).

Next, patterning of SD (source/drain) region is performed in Step S107 of FIG. 5, and ion implantation 20 is performed in a source region 11 and a drain region 12 at the both sides adjacent to the gate insulation film 14, thus forming the source region 11 and drain region 12, respectively (see FIG. 4B).

Corresponding to the deviation of the fabrication parameter, the source region 11 and drain region 12 are activated in a lamp-annealing step of a transistor to be fabricated subsequently (S108). Then, the threshold value is set to a predetermined value.

If the fabrication parameter does not deviate from the predetermined value, the oxygen concentration is set to 0% and the source region 11 and drain region 12 are activated (S107) (see FIG. 4C).

This embodiment has a characteristic in that, after performing the ion implantation for forming the source region 11 and drain region 12, an oxygen concentration in gas used for a SD (source/drain) lamp annealing 21 for activating the regions is controlled, as shown in FIG. 4C. In the method for fabricating a transistor of the present invention, the inventors of the present invention utilized the point that a threshold voltage Vth of the transistor fluctuates according to an oxygen concentration in nitrogen gas.

As shown in FIG. 4C, in the present invention, an enhanced diffusibility of dopant, which has been ion-implanted into the source and drain during the SD (source/drain) lamp annealing 21, or of dopant, which has been ion-implanted into the gate, is changed by controlling the oxygen concentration. Thus, an impurity concentration distribution into a lower part of the gate is changed and a transistor characteristic is changed.

Figure 6:
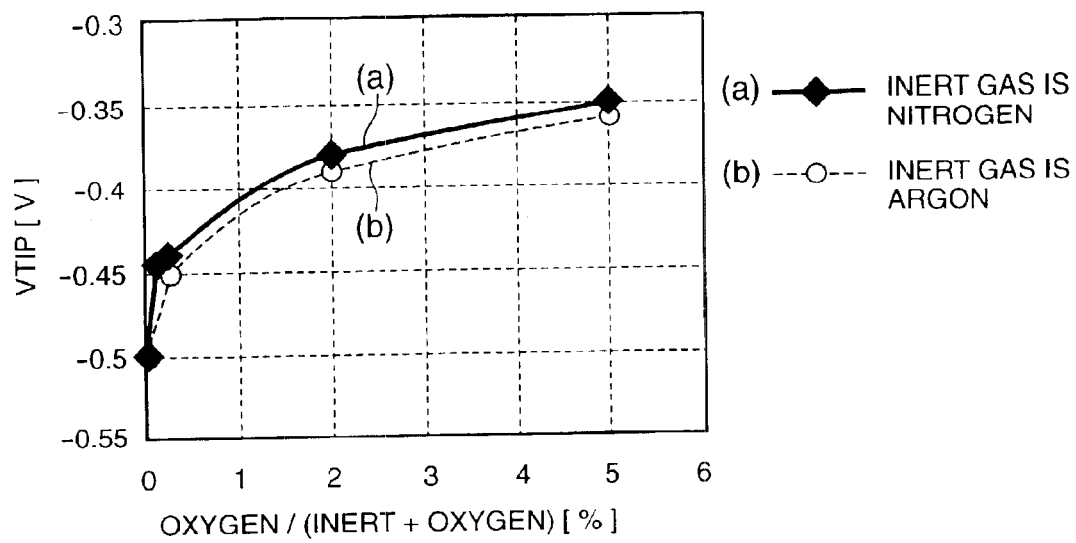
FIG. 6 depicts a graph showing a threshold voltage characteristic of a transistor according to the method for fabricating a transistor of the one embodiment of the present invention.

FIG. 6 depicts a graph showing fluctuation characteristic of a threshold voltage Vth of a P channel transistor (VT1P), with respect to an oxygen concentration in inert gas (nitrogen gas or argon gas) in the case of SD (source/drain) lamp annealing. The axis of abscissas denotes the oxygen concentration in the inert gas, and the axis of ordinates denotes the threshold voltage Vth.

First, a case where the inert gas is nitrogen gas will be explained. In this case, a thickness of a gate oxide film of the P channel transistor is 6 nm, and a width of the gate is 0.25 $\mu$m. In SD (source/drain) ion implantation, impurities $BF_2$ are implanted at ion implantation energy of 30 keV and by a dose amount of $3.0E15/cm^2$. Moreover, the annealing is performed at an annealing temperature of 1025° C. and for an annealing time of about 40 seconds.

The curve (a) in the graph of FIG. 6 shows the following: when the oxygen concentration is 0%, the threshold voltage Vth of the P channel transistor is −0.5V; when the oxygen concentration is 5%, the threshold voltage Vth of the P channel transistor is −0.35V; and when the oxygen concentration fluctuates in the range of 0 to 5%, the threshold voltage Vth of the P channel transistor fluctuates by 0.15V.

Therefore, by allowing the oxygen concentration to fluctuate in the range of 0 to 5%, the threshold voltage Vth of the P channel transistor can be changed by 0.15V. Specifically, it can be understood that the adjustment of the oxygen concentration enables the threshold voltage Vth of the P channel transistor to be set to its predetermined value.

Note that, the curve (a) of this graph shows the oxygen concentration in the nitrogen gas, and the oxygen concentration therein is fluctuated in the range of 0 to 5%.

Next, instead of the nitrogen gas, argon gas can be used as the inert gas. In other words, a case where the inert gas is the argon gas will be explained.

In this case, similar to the case of the nitrogen gas, a thickness of a gate oxide film of the P channel transistor is 6 nm, and a width of the gate is 0.25 $\mu$m. In SD (source/drain) ion implantation, impurities $BF_2$ are implanted at ion implantation energy of 30 keV and by a dose amount of $3.0E15/cm^2$. Moreover, the annealing is performed at an annealing temperature of 1025° C. and for an, annealing time of about 40 seconds.

The curve (b) in the graph of FIG. 6 shows the following: when the oxygen concentration is 0%, the threshold voltage Vth of the P channel transistor is −0.5V; when the oxygen concentration is 5%, the threshold voltage Vth of the P channel transistor is −0.34V; and when the oxygen concentration fluctuates in the range of 0 to 5%, the threshold voltage Vth of the P channel transistor fluctuates by 0.14V.

Therefore, by allowing the oxygen concentration to fluctuate in the range of 0 to 5%, the threshold voltage Vth of the P channel transistor can be changed by 0.14V. Specifically, it is the same as the case of the nitrogen gas that the adjustment of the oxygen concentration enables the threshold voltage Vth of the P channel transistor to be set to its predetermined value.

Moreover, in this case, the threshold voltage Vth of the P channel transistor becomes larger than its target value when the thickness of the gate oxide film becomes thicker than its target value or when the gate size becomes larger than its target value. However, the increase in the threshold voltage can be predicted from the respective values.

For example, in the case where the inert gas is the nitrogen gas, when a transistor is fabricated by setting the oxygen concentration in the SD (source/drain) lamp annealing to 0%, a measured value of the threshold voltage Vth is assumed to be −0.5V. Then, if the oxygen concentration in the SD (source/drain) lamp annealing is set to 2%, it is possible to fabricate a transistor having a threshold voltage Vth of −0.38V.

Note that, in this embodiment, the case where the oxygen concentration is set to 0% in the normal annealing is taken as a standard. However, when the case where the oxygen concentration is set to 1% is taken as the standard, the increase and decrease of the oxygen concentration enable the increase and decrease of the threshold voltage Vth. Moreover, the gate oxide film thickness and the gate length of a transistor determine the oxygen concentration in the SD (source/drain) lamp annealing. Moreover, the above-described SD (source/drain) lamp annealing is preferably performed in a heat treatment furnace.

As described above, according to the present invention, the effects are that, by changing the oxygen concentration in the lamp annealing, the threshold voltage of the transistor can be adjusted to a predetermined value and that the characteristic of the transistor can be easily adjusted without additional process steps.

What is claimed is:

1. A method for fabricating a transistor with a predetermined threshold voltage, comprising the steps of:

forming a gate film of a transistor and measuring a film thickness of the gate film (S101);

forming a gate electrode of the transistor on the gate film and measuring a gate length of the gate electrode (S102);

inputting a fabrication parameter in fabrication of the transistor (S103);

determining whether or not the fabrication parameter deviates from a predetermined value of a fabrication parameter (S104);

when the fabrication parameter varies from the predetermined value, calculating a fabrication parameter discrepancy between the fabrication parameter and the predetermined value and predicting a deviation of the fabrication parameter (S105);

in a lamp-annealing step of the transistor to be subsequently fabricated, deciding an oxygen concentration in inert gas of the lamp annealing, corresponding to the variation of the fabrication parameter (S106);

forming source and drain regions of the transistor, respectively, by ion implantation (S107), performing the lamp-annealing in the regions with the oxygen concentration in the inert gas of the lamp annealing (S106) and setting the threshold value to the predetermined value; and in the case where the fabrication parameter does not deviate from the predetermined value in the Step S104, deciding the oxygen concentration in the inert gas of the lamp annealing to be 0% (S110), and proceeding to Step S107.

2. The method for fabricating a transistor with a predetermined threshold voltage according to claim 1, wherein the fabrication parameter is the film thickness of the gate film of the transistor.

3. The method for fabricating a transistor with a predetermined threshold voltage according to claim 1, wherein the fabrication parameter is the gate length of the transistor.

4. The method for fabricating a transistor with a predetermined threshold voltage according to claim 3,
wherein the gate length of the transistor is obtained in such a manner that several spots along the X direction of a wafer including a center of the wafer, and several spots along the Y direction including the center of the wafer are measured, respectively, a plurality of pieces of wafers are sampled from a production lot of the wafer, measurement of the wafers is performed regarding the gate length of the transistor, and obtain an average value of the measurement data, which is set to be a representative value of the lot.

5. The method for fabricating a transistor with a predetermined threshold voltage according to claim 1,
wherein, when the oxygen concentration of the lamp-annealing step is increased, a threshold voltage of the transistor is increased.

6. The method for fabricating a transistor with a predetermined threshold voltage according to claim 1,
wherein, the oxygen concentration of the lamp-annealing step allows a ratio of the oxygen in the inert gas to be set to a predetermined value, and sets a threshold value of the transistor.

7. The method for fabricating a transistor with a predetermined threshold voltage according to claim 5,
wherein, the oxygen concentration of the lamp-annealing step allows a ratio of the oxygen in the inert gas to be set to a predetermined value, and sets a threshold value of the transistor.

8. The method for fabricating a transistor with a predetermined threshold voltage according to claim 1,
wherein the transistor is a field effect transistor.

9. The method for fabricating a transistor with a predetermined threshold voltage according to claim 8,
wherein a thickness of a gate oxide film of the transistor is 6 nm and a gate width size of the transistor is 0.25 $\mu$m.

10. The method for fabricating a transistor with a predetermined threshold voltage according to claim 9,
wherein, in ion implantation into source and drain of the transistor, impurities $BF_2$ are implanted at ion implantation energy of 30 keV and by a dose amount of $3.0E15/cm^2$.

11. The method for fabricating a transistor with a predetermined threshold voltage according to claim 1,
wherein, the oxygen concentration of the lamp-annealing step, a ratio of the oxygen in the inert gas is changed in the range of 0 to 5%.

12. The method for fabricating a transistor with a predetermined threshold voltage according to claim 1,
wherein nitrogen gas is used as the inert gas.

13. The method for fabricating a transistor with a predetermined threshold voltage according to claim 11,
wherein nitrogen gas is used as the inert gas.

14. The method for fabricating a transistor with a predetermined threshold voltage according to claim 11,
wherein argon gas is used as the inert gas.

15. The method for fabricating a transistor with a predetermined threshold voltage according to claim 11,
wherein the lamp annealing step is performed at an annealing temperature of 1025° C. and for an annealing time of about 40 seconds.

16. The method for fabricating a transistor with a predetermined threshold voltage according to claim 11,
wherein the lamp-annealing step is performed in a heat treatment furnace.

* * * * *